United States Patent
Chen

(10) Patent No.: US 11,236,268 B2
(45) Date of Patent: Feb. 1, 2022

(54) METHOD FOR PREPARING INORGANIC HALOGENATED LEAD CESIUM PEROVSKITE QUANTUM DOTS AND DISPLAY DEVICE

(71) Applicant: Wuhan China Star Optoelectronics Semiconductor Display Technology Co., Ltd., Hubei (CN)

(72) Inventor: Xu Chen, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 301 days.

(21) Appl. No.: 16/462,935

(22) PCT Filed: Feb. 20, 2019

(86) PCT No.: PCT/CN2019/075555
§ 371 (c)(1),
(2) Date: May 22, 2019

(87) PCT Pub. No.: WO2020/082646
PCT Pub. Date: Apr. 30, 2020

(65) Prior Publication Data
US 2020/0407632 A1    Dec. 31, 2020

(30) Foreign Application Priority Data
Oct. 25, 2018   (CN) .......................... 201811251131.1

(51) Int. Cl.
*C09K 11/77*    (2006.01)
*H01L 51/50*    (2006.01)
(Continued)

(52) U.S. Cl.
CPC .......... *C09K 11/772* (2013.01); *C09K 11/665* (2013.01); *H01L 51/502* (2013.01); *B82Y 20/00* (2013.01); *B82Y 40/00* (2013.01)

(58) Field of Classification Search
CPC ................................................... C09K 11/663
See application file for complete search history.

(56) References Cited

U.S. PATENT DOCUMENTS

2017/0155020 A1* 6/2017 Lin ..................... H01L 33/502
2019/0345382 A1   11/2019 Chen

FOREIGN PATENT DOCUMENTS

CN   106753355      *   5/2017
CN   108192606 A        6/2018
(Continued)

OTHER PUBLICATIONS

Translation for CN 106753355, May 31, 2017.*
(Continued)

*Primary Examiner* — C Melissa Koslow
(74) *Attorney, Agent, or Firm* — Hamre, Schumann, Mueller & Larson, P.C.

(57) ABSTRACT

A method for preparing inorganic halogenated lead perovskite quantum dots and a display device are provided. The method includes: a first coordination solution preparing step, a cesium oleate solution preparing step, a centrifugal separation step, a second coordination solution preparing step, a first ion exchange step, and a second ion exchange step. The present invention also provides a display device including a quantum dot layer, wherein luminescent quantum dots of the quantum dot layer are inorganic halogenated lead cesium perovskite quantum dots of the present invention.

9 Claims, 2 Drawing Sheets

(51) Int. Cl.
    *C09K 11/66*     (2006.01)
    *B82Y 20/00*     (2011.01)
    *B82Y 40/00*     (2011.01)

(56) References Cited

FOREIGN PATENT DOCUMENTS

| | | |
|---|---|---|
| CN | 108502918 A | 9/2018 |
| CN | 108504355 A | 9/2018 |

OTHER PUBLICATIONS

Ripka et al., Understanding the Surface Properties of Halide Exchanged Cesium Lead Halide Nanoparticles, Langmuir, Aug. 22, 2018, pp. 11139-11146.*

Seth, S. and Samanta, A., A Facile Methodology for Engineering the Morphology of CsPbX3 Perovskite Nanocrystals under Ambient Condition, Scientific Reports 6, Article No. 37693 (2016).

Wei, S., Yang Y., Kang, X., Wang, L., Huang., Pan, D., Room-temperature and gram-scale synthesis of CsPbX3 (X=Cl, Br, I) perovskite nanocrystals with 50-85% photoluminescence quantum yields, Royal Society of Chemistry (2016), abstract only.

Percova, A., Matyushkin, L.B., Synthesis and postsynthetic anion exchange of CsPbX3 (X=Cl, Br, I) quantum dots, J. Phys.: Conf. Ser. 917 062041 (2017).

\* cited by examiner

METHOD FOR PREPARING INORGANIC HALOGENATED LEAD CESIUM PEROVSKITE QUANTUM DOTS AND DISPLAY DEVICE

FIELD OF INVENTION

The present invention relates to a field of inorganic luminescent materials, in particular to a method for preparing inorganic halogenated lead cesium perovskite quantum dots and a display device.

DESCRIPTION OF PRIOR ART

Cesium perovskite quantum dots are the most popular material in recent years. They are widely used in researches on solar cells, lasers, light-emitting diodes (LEDs), and flat panel displays due to their excellent electrical properties, such as high electron mobility, great exciton binding energy, and a long diffusion distance, as well as their optical properties, such as extremely high fluorescence quantum efficiency, and great technological breakthroughs achieved in recent years.

Quantum dots are considered to be another significant display technology materials after liquid crystal displays (LCDs) and organic light-emitting diodes (OLEDs), due to their excellent thermal stability, high quantum efficiency, narrow half-peak width, and high color gamut. Currently, all major companies have products involving quantum dots on the market. A conventional method for preparing quantum dots is difficult to operate, such that quantum dots cannot be obtained quickly, and the quantum dots cannot be circulated to obtain different quantum dots.

SUMMARY OF INVENTION

The present invention provides a preparation method and a display device for inorganic halogenated lead cesium perovskite quantum dots, in order to solve the problems of reaction conditions, difficult operation, failure of circularly synthesizing inorganic halogenated lead cesium perovskite quantum dots.

In order to solve the above technical problem, the present invention provides a method for preparing inorganic halogenated lead cesium perovskite quantum dots, which includes the following steps:

a first coordination solution preparing step, comprising mixing and heating a first lead halide solid and a first solvent in a reaction vessel until the first lead halide solid is completely dissolved to obtain a first coordination solution;

a cesium oleate solution preparing step, comprising mixing and heating a cesium carbonate solid and a second solvent in a container until the cesium carbonate solid is completely dissolved;

a centrifugal separation step, comprising heating the first coordination solution and adding the cesium oleate solution to the first coordination solution, cooling the first coordination solution to room temperature to obtain a first mixed solution, and centrifuging the first mixed solution to obtain first quantum dots;

a second coordination solution preparing step, comprising mixing and heating a second lead halide solid and the first solvent in a reaction vessel until the second lead halide solid is completely dissolved to obtain a second coordination solution;

a first ion exchange step, comprising re-dispersing the first quantum dots in a non-polar organic solvent, adding the second coordination solution dropwise to the non-polar organic solvent, performing an ion exchange reaction to obtain a second mixed solution, and centrifuging the second mixed solution to obtain second quantum dots.

Further, halogen elements of the first lead halide solid and the second lead halide solid are any one of Br, I and Cl, and the halogen element of the first lead halide solid is different from the halogen element of the second lead halide solid.

Further, the first solvent comprises oleic acid, oleyl amine, and a non-polar organic solvent.

Further, the non-polar organic solvent is dodecane or octadecene.

Further, in the first solvent, a volume ratio of the oleic acid, the oleyl amine, and the non-polar organic solution is 1-2:1-2:4-8.

Further, in the cesium oleate solution preparing step, the second solvent comprises oleic acid and octadecene solvent, and the heating is carried out at a temperature of 120-150 degrees in Celsius; and in the centrifugal separation step, the heating is carried out at a temperature of 180 to 200 degrees in Celsius.

Further, a structure and a diameter of each of the first quantum dots are consistent with a structure and a diameter of each of the second quantum dots.

Further, the first ion exchange step further comprises: a third coordination solution preparing step, comprising mixing and heating a third lead halide solid and the first solvent in a reaction vessel until the solid is completely dissolved to obtain a third coordination solution; a second ion exchange step, comprising re-dispersing the second quantum dots in a non-polar organic solvent, adding the third coordination solution in drops to the non-polar organic solvent, performing an ion exchange reaction to obtain a third mixed solution, and centrifuging the third mixed solution to obtain third quantum dots, each of which is an inorganic halogenated lead perovskite quantum dot.

Further, halogen elements of the second lead halide solid and the third lead halide solid are any one of Br, I and Cl, and the halogen element of the second lead halide solid is different from the halogen element of the third lead halide solid.

Further, the present invention provides a display device, comprising a quantum dot layer, wherein luminescent quantum dots of the quantum dot layer are inorganic halogenated lead perovskite quantum dots In the method for preparing inorganic halogenated lead cesium perovskite quantum dots and a display device according to the present invention, the synthesized first quantum dot solution is added dropwise to a suitable amount of a second lead halide or a third lead halide solution prepared in advance to provide a second quantum dot solution or third quantum dot solution. Similarly, the first quantum dot solution can also be prepared by adding the first lead halide solution to the second quantum dot solution or the third quantum dot solution. The ion reaction process is recyclable and reversible, and the reaction conditions are mild. Comparing the quantum dots before ion exchange, the structure and diameter of the quantum dots are unchanged after ion exchange.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

Method Example 1

Figure 1:
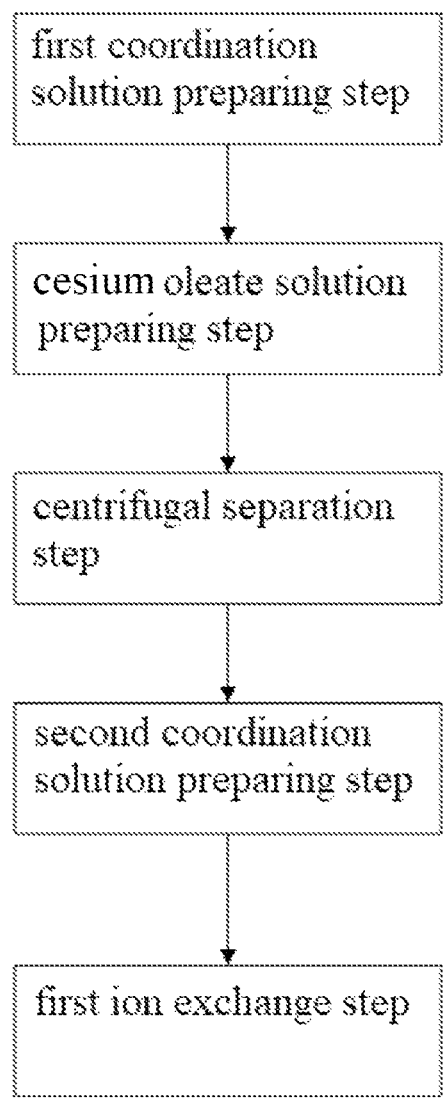
FIG. 1 is a flow chart of a method for preparing inorganic halogenated lead cesium perovskite quantum dots provided by the present invention.

In order to solve the above technical problem, the present invention provides a method for preparing inorganic halogenated lead cesium perovskite quantum dots, which includes the following steps:

Preparing a first coordination solution step, including: mixing and heating a first lead halide solid (0.2 mol) and a first solvent in a reaction vessel until the first lead halide solid is completely dissolved to obtain a first coordination solution, wherein a halogen element of the first lead halide solid is a Br element, and the first solvent includes oleic acid (0.5 ml), oleylamine (0.5 ml), and a non-polar organic solvent (3 ml). The non-polar organic solvent is dodecane, and in other embodiments, it may be an octadecene solvent. In the first solvent, the volume ratio of the oleic acid, the oleylamine, and the non-polar organic solution is 1:1:6, and in other embodiments, it may be 1:1:8 or 2:2:8.

A cesium oleate solution preparing step, comprising mixing and heating a cesium carbonate ($Cs_2CO_3$) solid and a second solvent in a vessel until the solid is completely dissolved. The second solvent includes oleic acid and the octadecene solvent and the heating is carried out at a temperature of 120-150 degrees in Celsius. In other embodiments, the heating may be carried out at a temperature of 140 or 150 degrees in Celsius.

A centrifugal separation step, comprising heating the first coordination solution and adding the cesium oleate solution to the first coordination solution, cooling the first coordination solution to room temperature to obtain a first mixed solution, and centrifuging the first mixed solution to obtain first quantum dots, wherein the heating is carried out at a temperature of 180 degrees in Celsius. In other embodiments, the heating may be carried out at a temperature of 190 or 200 degrees in Celsius.

A second coordination solution preparing step, comprising mixing and heating a second lead halide solid and the first solvent in a reaction vessel until the second lead halide solid is completely dissolved to obtain a second coordination solution, wherein a halogen element of the second lead halide solid is an I element.

A first ion exchange step, comprising re-dispersing the first quantum dots in a non-polar organic solvent, adding the second coordination solution dropwise to the non-polar organic solvent, performing an ion exchange reaction to obtain a second mixed solution, and centrifuging the second mixed solution to obtain second quantum dots, wherein a structure and a diameter of each of the first quantum dots are consistent with a structure and a diameter of each of the second quantum dots. During the reaction, the Br element and the I element are replaced by ion forms, and the reaction process is reversible, and it can be prepared quickly without the need of catalytic conditions.

The first ion exchange step further comprises:

A third coordination solution preparing step, comprising mixing and heating a third lead halide solid and the first solvent in a reaction vessel until the solid is completely dissolved to obtain a third coordination solution, wherein a halogen element of the third lead halide solid is any one of Br or Cl, and in this embodiment, the halogen element is a Br element.

A second ion exchange step, comprising re-dispersing the second quantum dots in a non-polar organic solvent, adding the third coordination solution in drops to the non-polar organic solvent, performing an ion exchange reaction to obtain a third mixed solution, and centrifuging the third mixed solution to obtain third quantum dots, wherein a structure and a diameter of each of the third quantum dots are consistent with a structure and a diameter of each of the second quantum dots. During the reaction, the Br element and the I element are replaced by ion forms, and the reaction process is reversible, and it can be prepared quickly without the need of catalytic conditions.

In Method Example 1, the method for preparing the inorganic halogenated lead cesium perovskite quantum dots is mild in reaction conditions, simple in operation, and circularly reversible.

Method Example 2

The present invention provides another embodiment of the method for preparing inorganic halogenated lead cesium perovskite quantum dots, including the following steps:

A first coordination solution preparing step, including: mixing and heating a first lead halide solid (0.2 mol) and a first solvent in a reaction vessel heating until the first lead halide solid is completely dissolved to obtain a first coordination solution, wherein a halogen element of the first lead halide solid is a Cl element, and the first solvent includes oleic acid (0.5 ml), oleylamine (0.5 ml), and a non-polar organic solvent (3 ml). The non-polar organic solvent is dodecane, and in other embodiments, it may be an octadecene solvent. In the first solvent, the volume ratio of the oleic acid, the oleylamine, and the non-polar organic solution is 1:1:6, and in other embodiments, it may be 1:1:8 or 2:2:8.

A cesium oleate solution preparing step, comprising mixing and heating a cesium carbonate ($Cs_2CO_3$) solid and a second solvent in a vessel until the solid is completely dissolved. The second solvent includes oleic acid and the octadecene solvent, and the heating is carried out at a temperature of 120-150 degrees in Celsius. In other embodiments, the heating may be carried out at a temperature of 140 or 150 degrees in Celsius.

A centrifugal separation step, comprising heating the first coordination solution and adding the cesium oleate solution to the first coordination solution, cooling the first coordination solution to room temperature to obtain a first mixed solution.

A second coordination solution preparing step, comprising mixing and heating the second lead halide solid and the first solvent in a reaction vessel until the second lead halide solid is completely dissolved to obtain a second coordination solution, wherein a halogen element of the second lead halide solid is a Br element, and the heating is carried out at a temperature of 180-200 degrees in Celsius.

A first ion exchange step, comprising re-dispersing the first quantum dots in a non-polar organic solvent, adding the second coordination solution dropwise to the non-polar organic solvent, performing an ion exchange reaction to obtain a second mixed solution, and centrifuging the second mixed solution to obtain second quantum dots, wherein a structure and a diameter of each of the first quantum dots are consistent with a structure and a diameter of each of the second quantum dots. During the reaction, the Cl element and the Br element are replaced by ion forms, and the reaction process is reversible, and it can be prepared quickly without the need of catalytic conditions.

The first ion exchange step further comprises:

A third coordination solution preparing step, comprising mixing and heating a third lead halide solid and the first solvent in a reaction vessel until the solid is completely dissolved to obtain a third coordination solution, wherein a halogen element of the third lead halide solid is any one of I or Cl, and in this embodiment, the halogen element is I element.

A second ion exchange step, comprising re-dispersing the second quantum dots in a non-polar organic solvent, adding the third coordination solution in drops to the non-polar organic solvent, performing an ion exchange reaction to obtain a third mixed solution, and centrifuging the third mixed solution to obtain third quantum dots, wherein a structure and a diameter of each of the third quantum dots are consistent with a structure and a diameter of each of the second quantum dots. During the reaction, the Br element and the I element are replaced by ion forms, and the reaction process is reversible, and it can be prepared quickly without the need of catalytic conditions.

In Method Example 2, the method for preparing inorganic halogenated lead cesium perovskite quantum dots is mild in reaction conditions, simple in operation, and circularly reversible.

Method Example 3

The present invention provides still another embodiment of the method for preparing inorganic halogenated lead cesium perovskite quantum dots, including the following steps:

A first coordination solution preparing step, including: mixing and heating a first lead halide solid (0.2 mol) and a first solvent in a reaction vessel until the first lead halide solid is completely dissolved to obtain a first coordination solution, wherein the halogen element of the first lead halide solid is an I element; and the first solvent includes oleic acid (0.5 ml), oleylamine (0.5 ml), and a non-polar organic solvent (3 ml). The non-polar organic solvent is dodecane, and in other embodiments, it may be an octadecene solvent. In the first solvent, the volume ratio of the oleic acid, the oleylamine, and the non-polar organic solution is 1:1:6, and in other embodiments, it may be 1:1:8 or 2:2:8.

A cesium oleate solution preparing step, comprising mixing and heating cesium carbonate ($Cs_2CO_3$) solid and a second solvent in a vessel until the solid is completely dissolved. The second solvent includes oleic acid and octadecene solvent, and the heating is carried out at a temperature of 120-150 degrees in Celsius. In other embodiments, the heating may be carried out at a temperature of 140 or 150 degrees in Celsius.

A centrifugal separation step, comprising heating the first coordination solution and adding the cesium oleate solution to the first coordination solution, cooling the first coordination solution to room temperature to obtain a first mixed solution, and centrifuging the first mixed solution to obtain first quantum dots.

A second coordination solution preparing step, comprising mixing and heating the second lead halide solid and the first solvent in a reaction vessel until the second lead halide solid is completely dissolved to obtain a second coordination solution, wherein a halogen element of the second lead halide solid is a Br element, and the heating is carried out at a temperature of 180-200 degrees in Celsius.

A first ion exchange step, comprising re-dispersing the first quantum dots in a non-polar organic solvent, adding the second coordination solution dropwise to the non-polar organic solvent, performing an ion exchange reaction to obtain a second mixed solution, and centrifuging the second mixed solution to obtain second quantum dots, wherein a structure and a diameter of each of the first quantum dots are consistent with a structure and a diameter of each of the second quantum dots. During the reaction, the Br element and the I element are replaced by ion forms, and the reaction process is reversible, and it can be prepared quickly without the need of catalytic conditions.

The first ion exchange step further comprises:

A third coordination solution preparing step, comprising mixing and heating a third lead halide solid and the first solvent in a reaction vessel until the solid is completely dissolved to obtain a third coordination solution, wherein a halogen element of the third lead halide solid is any one of Cl or I, and in this embodiment, the halogen element is a Cl element.

A second ion exchange step, comprising re-dispersing the second quantum dots in a non-polar organic solvent, adding the third coordination solution in drops to the non-polar organic solvent, performing an ion exchange reaction to obtain a third mixed solution, and centrifuging the third mixed solution to obtain third quantum dots, wherein a structure and a diameter of each of the third quantum dots are consistent with a structure and a diameter of each of the second quantum dots. During the reaction, the Br element and the I element are replaced by ion forms, and the reaction process is reversible, and it can be prepared quickly without the need of catalytic conditions.

In Method Example 3, the method for preparing inorganic halogenated lead cesium perovskite quantum dots is mild in reaction conditions, simple in operation, and circularly reversible.

Application Example

The quantum dots according to the present invention are further applied to display devices in view of their excellent thermal stability, high quantum efficiency, narrow half-peak width, and high color gamut characteristics.

The present invention provides a display device mainly including a quantum dot layer 13, and luminescent quantum dots of the quantum dot layer are inorganic halogenated lead cesium perovskite quantum dots according to the embodiments of the present invention.

Figure 2:
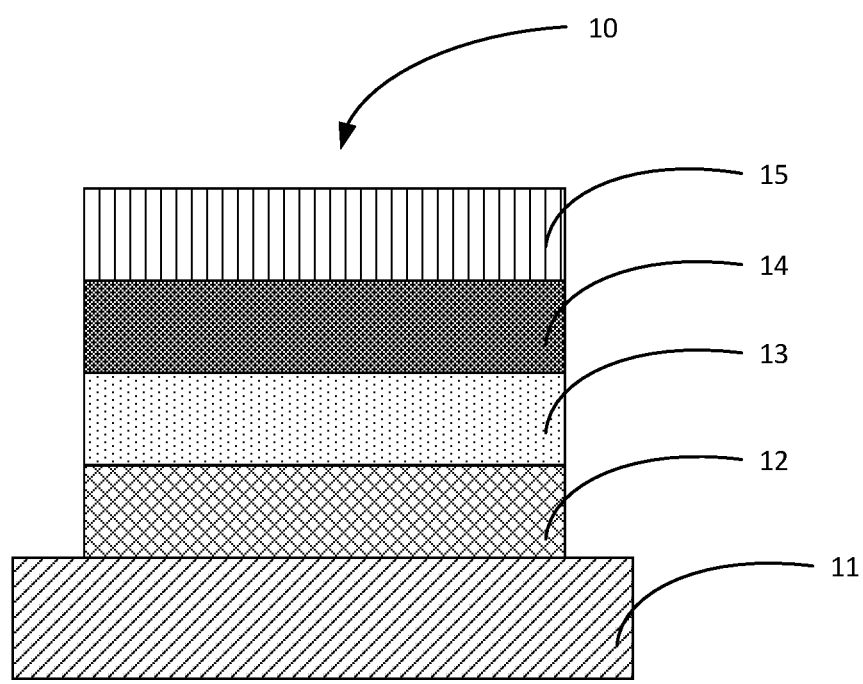
FIG. 2 is a cross-sectional view showing a structure of a display device of an example of application.

As shown in FIG. 2, the display device 10 includes a substrate layer 11, a first functional layer 12, a quantum dot layer 13, a second functional layer 14, and a cathode layer 15. The substrate layer 11 is conductive glass; the first functional layer 12 is a hole transport layer attached to a side of the substrate 11; the quantum dot layer 13 is attached to a side of the first functional layer 12 away from the substrate 11; the second functional layer 14 is an electron transport layer attached to the quantum dot layer 13 is away from the side of the first functional layer 12; and the cathode layer 15 is attached to a side of the second functional layer 14 away from the quantum dot layer 13.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A method for preparing inorganic halogenated lead perovskite quantum dots (PQDs), comprising the following steps:
   a first coordination solution preparing step, comprising mixing and heating a first lead halide solid and a first solvent in a reaction vessel until the first lead halide solid is completely dissolved to obtain a first coordination solution;
   a cesium oleate solution preparing step, comprising mixing and heating a cesium carbonate solid and a second solvent in a container until the cesium carbonate solid is completely dissolved;
   a centrifugal separation step, comprising heating the first coordination solution and adding the cesium oleate solution to the first coordination solution, cooling the first coordination solution to room temperature to obtain a first mixed solution, and centrifuging the first mixed solution to obtain first quantum dots;
   a second coordination solution preparing step, comprising mixing and heating a second lead halide solid and the first solvent in a reaction vessel until the second lead halide solid is completely dissolved to obtain a second coordination solution; and
   a first ion exchange step, comprising re-dispersing the first quantum dots in a non-polar organic solvent, adding the second coordination solution dropwise to the non-polar organic solvent, performing an ion exchange reaction to obtain a second mixed solution, and centrifuging the second mixed solution to obtain second quantum dots; wherein
   the first quantum dots and the second quantum dots are both the inorganic halogenated lead perovskite quantum dots.

2. The method for preparing the inorganic halogenated lead perovskite quantum dots according to claim 1, wherein halogen elements of the first lead halide solid and the second lead halide solid are any one of Br, I, and Cl, and the halogen element of the first lead halide solid is different from the halogen element of the second lead halide solid.

3. The method of preparing the inorganic halogenated lead perovskite quantum dots according to claim 1, wherein the first solvent comprises oleic acid, oleyl amine, and the non-polar organic solvent.

4. The method for preparing the inorganic halogenated lead perovskite quantum dots according to claim 3, wherein the non-polar organic solvent is dodecane or octadecene.

5. The method for preparing the inorganic halogenated lead perovskite quantum dots according to claim 3, wherein in the first solvent, a volume ratio of the oleic acid, the oleyl amine, and the non-polar organic solvent is 1-2:1-2:4-8.

6. The method for preparing the inorganic halogenated lead perovskite quantum dots according to claim 1, wherein
   in the cesium oleate solution preparing step, the second solvent comprises oleic acid and octadecene solvent, and the heating is carried out at a temperature of 120-150 degrees in Celsius; and
   in the centrifugal separation step, the heating is carried out at a temperature of 180 to 200 degrees in Celsius.

7. The method for preparing the inorganic halogenated lead perovskite quantum dots according to claim 1, wherein a structure and a diameter of each of the first quantum dots are consistent with a structure and a diameter of each of the second quantum dots.

8. The method for preparing the inorganic halogenated lead perovskite quantum dots according to claim 1, wherein the first ion exchange step further comprises:
   a third coordination solution preparing step, comprising mixing and heating a third lead halide solid and the first solvent in a reaction vessel until the third lead halide solid is completely dissolved to obtain a third coordination solution; and
   a second ion exchange step, comprising re-dispersing the second quantum dots in a non-polar organic solvent, adding the third coordination solution in drops to the non-polar organic solvent, performing an ion exchange reaction to obtain a third mixed solution, and centrifuging the third mixed solution to obtain third quantum dots, each of which is the inorganic halogenated lead perovskite quantum dot.

9. The method for preparing the inorganic halogenated lead perovskite quantum dots according to claim 8, wherein halogen elements of the second lead halide solid and the third lead halide solid are any one of Br, I, and Cl, and the halogen element of the second lead halide solid is different from the halogen element of the third lead halide solid.

* * * * *